(12) United States Patent  (10) Patent No.: US 6,341,081 B2
Kang  (45) Date of Patent: Jan. 22, 2002

(54) CIRCUIT FOR DRIVING NONVOLATILE FERROELECTRIC MEMORY

(75) Inventor: Hee Bok Kang, Daejeon-si (KR)

(73) Assignee: Hyundai Electronics Industries Co. Ltd., Seoul (KR)

( * ) Notice: Subject to any disclaimer, the term of this patent is extended or adjusted under 35 U.S.C. 154(b) by 0 days.

(21) Appl. No.: 09/778,948

(22) Filed: Feb. 8, 2001

Related U.S. Application Data

(62) Division of application No. 09/240,887, filed on Feb. 1, 1999, now Pat. No. 6,188,599.

(30) Foreign Application Priority Data

May 13, 1998  (KR) ............................................. 98-17213

(51) Int. Cl.$^7$ ............................................... G11C 11/22
(52) U.S. Cl. ......................... 365/145; 365/65; 365/210; 365/207
(58) Field of Search ............................. 365/51, 63, 65, 365/145, 185.11, 185.12, 210, 230.03, 230.06, 207

(56) References Cited

U.S. PATENT DOCUMENTS

| | | | |
|---|---|---|---|
| 4,433,390 A | 2/1984 | Carp et al. | 364/900 |
| 4,873,664 A | 10/1989 | Eaton et al. | 365/145 |
| 4,888,630 A | 12/1989 | Paterson | 357/23.5 |
| 4,928,095 A | 5/1990 | Kawahara | 340/784 |
| 5,297,077 A | 3/1994 | Imai et al. | 365/145 |
| 5,371,699 A | 12/1994 | Larson | 365/145 |
| 5,638,318 A | 6/1997 | Seyyedy | 365/145 |
| 5,680,344 A | 10/1997 | Seyyedy | 365/145 |
| 5,680,357 A * | 10/1997 | Sung et al. | 365/210 |
| 5,737,260 A * | 4/1998 | Taka et al. | 365/145 |
| 5,872,739 A | 2/1999 | Womack | 365/207 |
| 5,930,180 A * | 7/1999 | Callahan | 365/230.06 |
| 5,953,274 A * | 9/1999 | Iwahashi | 365/207 |
| 6,002,625 A * | 12/1999 | Ahn | 365/207 |
| 6,091,622 A * | 7/2000 | Kang | 365/145 |
| 6,128,213 A * | 10/2000 | Kang | 365/145 |
| 6,188,599 B1 * | 3/2001 | Kang | 365/145 |
| 6,215,692 B1 * | 4/2001 | Kang | 365/145 |
| 6,240,007 B1 * | 5/2001 | Kang | 365/145 |

* cited by examiner

Primary Examiner—Richard Elms
Assistant Examiner—Van Thu Nguyen
(74) Attorney, Agent, or Firm—Fleshner & Kim, LLP

(57) ABSTRACT

A nonvolatile ferroelectric memory has a plurality of bitlines, a plurality of wordlines and plate lines formed in a direction crossing the bitlines, and a reference bitline on one side of the plurality of bitlines. A cell array has a plural repetition of the plurality of bitlines and the reference bitline on one side thereof, a sense amplifier array having a plurality of sense amplifiers for sensing data on the bitlines and the reference bitlines in the cell array, a wordline and plateline driver for selective application of driving signals to the wordlines and the platelines, and a switching unit for selective turning on/off of the bitlines, the reference bitlines, and the input/output nodes on the sense amplifier array, whereby improving chip operation performance and lifetime of the chip.

23 Claims, 12 Drawing Sheets

E : electric field
P : polarity

US 6,341,081 B2

CIRCUIT FOR DRIVING NONVOLATILE FERROELECTRIC MEMORY

This application is a Divisional of application Ser. No. 09/240,887 filed Feb. 1, 1999 now U.S. Pat. No. 6,188,599.

BACKGROUND OF THE INVENTION

1. Field of the Invention

The present invention relates to a semiconductor memory, and more particularly, to a circuit for driving a nonvolatile ferroelectric memory.

2. Background of the Related Art

A ferroelectric random access memory (FRAM) has a data processing speed as fast as a DRAM and conserves data even after the power is turned off. The FRAM includes capacitors similiar to the DRAM, but the capacitors have a ferroelectric substance for utilizing the characteristic of a high residual polarization of the ferroelectric substance in which data is not lost even after eliminating an electric field applied thereto.

FIG. 1A illustrates a general hysteresis loop of a ferroelectric substance, and FIG. 1B illustrates a construction of a unit capacitor in a background art ferroelectric memory. As shown in the hysteresis loop in FIG. 1A, a polarization induced by an electric field does not vanish, but remains at a certain portion ("d" or "a" state) even after the electric field is cleared due to an existence of a spontaneous polarization. These "d" and "a" states may be matched to binary values of "1" and "0" for use as a memory cell. Referring to FIG. 1B, the state in which a positive voltage is applied to a node 1 is a "c" state in FIG. 1A, the state in which no voltage is applied thereafter to the node 1 is a "d" state. Opposite to this, if a negative voltage is applied to the node 1, the state moves from the "d" to an "f" state. If no voltage is applied to the node 1, thereafter the state moves to an "a" state. If a positive voltage is applied again, the states moves the "c" state via the "b" state. At the end, even if there is no voltage applied on both ends of a capacitor, a data can be stored in stable state of "a" and "d". On the hysteresis loop, "c" and "d" states correspond to a binary logic value of "1", and "a" and "f" states correspond to a binary logic value of "0".

In reading a data from the capacitor, the "d" state is destroyed to read the data stored in the capacitor. In a background art, a sense amplifier is used for reading a data using a voltage generated in a reference voltage generator and a voltage generated in a main cell array. In a ferroelectric reference cell, two modes of "1" polarity and "0" polarity are used for generating a reference voltage on a reference bitline. Accordingly, the sense amplifier compares a bitline voltage on a main cell and a reference bitline voltage on a reference cell, to read information in the main cell. By rewriting the read data within the same cycle, the destroyed data can be recovered.

FIG. 2 illustrates a unit cell of a background art ferroelectric memory. The unit cell of a background art ferroelectric memory is provided with a bitline B/L formed in a direction, a wordline W/L formed in a direction crossing the bitline, a plateline P/L formed in the same direction with the wordline spaced therefrom, a transistor T1 having a gate connected to the wordline and a source connected to the bitline, and a ferroelectric capacitor FC1 having a first terminal connected to a drain of the transistor T1 and a second terminal connected to the plateline.

FIGS. 3a and 3b together illustrate a circuit for driving the background art one transistor/one capacitor (1T/1C) ferroelectric memory of FIG. 2. A reference voltage generating part 1 generates a reference voltage, and a reference voltage stabilizing part 2 having a plurality of transistors Q1~Q4 and a capacitor C1 stabilizes a reference voltage on two adjacent bitlines B1 and B2 because the reference voltage from the reference voltage generating part 1 can not be provided to a sense amplifier directly. A first reference voltage storage part 3 having a plurality of transistors Q6~Q7 and capacitors C2~C3 stores a logic value "0" in adjacent bit lines. A first equalizing part 4 having a transistor Q5 equalizes adjacent two bitlines.

A first main cell array part 5 connected to wordlines W/L and platelines P/L different from one another stores data, and a first sense amplifier part 6 having a plurality of transistors Q10~Q15 and P-sense amplifiers PSA senses a data in a cell selected by the wordline from the plurality of cells in the main cell array part 5. A second main cell array part 7 connected to wordlines and platelines different from one another stores data, and a second reference voltage storage part 8 having a plurality of transistors Q~Q29 and capacitors C9~C10 stores a logic value "1" and a logic value "0" in adjacent bit lines. A second sense amlifier part 9 having a plurality of transistors Q15~Q24 and N-sense amplifiers NSA senses a data in the second main cell array part 7.

FIG. 4 illustrates a timing diagram showing a write mode operation of the background art ferroelectric memory. First, when a chip enable signal CSBpad received externally is enabled from "high" to "low" and a write enable signal WEBpad also transits from "high" to "low", the write mode is started. An address decoding is started in the write mode, to transit a pulse applied to a selected wordline from "low" to "high" to a selected cell. In an interval where the wordline is thus held at "high", a corresponding plateline P/L is applied of a "high" signal for an interval and a "low" signal for an interval in a sequence and a corresponding bitline is applied of a "high" or "low" signal synchronous to the write enable signal, for writing a logic "1" or "0" on the selected cell. In other words, if a signal applied to the plateline is "low" in an interval where the bitline is applied of a "high" signal and the wordline is applied of a "high" signal, a logic value "1" is written in the ferroelectric capacitor. If a signal applied to the plateline is "high" and the bitline is applied of a "low" signal, a logic value "0" is written in the ferroelectric capacitor.

The operation for reading a data stored in a cell with the write mode operation will be explained with reference to FIG. 5. When the chip enable signal CSBpad is enabled from "high" to "low" externally, all bitlines are equalized to "low" by an equalizer signal before selection of a corresponding wordline. As shown in FIGS. 3a and 3b, when a "high" signal is applied to the equalizer part 4 and a "high" signal is applied to transistors Q18 and Q19, grounding the bitlines through transistors Q18 and Q19, the bitlines are equalized to a low voltage Vss. The transistors Q5, Q18 and Q19 are turned off, disabling corresponding bitlines, and address is decoded for transiting a corresponding wordline from "low" to "high", to select a corresponding cell. Then, a "high" signal is applied to a plateline of the selected cell, to cancel data corresponding to a logic value "1" stored in an FRAM. If the FRAM is in storage of a logic value "0", a data corresponding to it will not be canceled. A cell with a canceled data and a cell with a data not canceled provide signals different from each other according to the aforementioned hysteresis loop principle. Data provided through the bitline is sensed by the sense amplifier of a logic value "1" or "0".

That is, referring to FIG. 1, since the case of a canceled data is a case when a state is changed from "d" to "f", and the case of a data not canceled is a case when a state is changed from "a" to "f", if the sense amplifier is enable after a certain time, in the case of the canceled data, the data is amplified to provide a logic value "1", and, in the case of the data not canceled, the data is amplified to provide a logic value "0". After the sense amplifier amplifies and provides a signal, since the cell should be recovered of an original data, during "high" is applied to a corresponding line, the plateline is disabled from "high" to "low". However, in the background art 1T/1C ferroelectric memory, in which the reference cell is operative more than the main memory cell in data input and output operations, the reference cell degrades rapidly.

Accordingly, the background art ferroelectric memory and a circuit for driving the same have various problems. Since one reference cell of a ferroelectric substance of which ferroelectric property is not fully assured is provided for a few hundreds of main memories for use in reading operation, requiring much more operation of the reference cell, the reference cell is involved in a rapid degradation of the ferroelectric property, causing instability of the reference voltage and subsequent degradation of device operation performance and life time.

SUMMARY OF THE INVENTION

Accordingly, the present invention is directed a circuit for driving a nonvolatile ferroelectric memory that substantially obviates one or more of the problems due to limitations and disadvantages of the related art.

An object of the present invention is to provide a circuit for driving a nonvolatile ferroelectric memory which improves device operation performance and life time.

To achieve these and other advantages and in accordance with the purpose of the present invention, as embodied and broadly described, the circuit for driving a nonvolatile ferroelectric memory, the memory having a plurality of bitlines, a plurality of wordlines and plate lines formed in a direction crossing the bitlines and a reference bitline on one side of the plurality of bitlines, includes a cell array having a plural times of repetitive arrangement of the plurality of bitlines and the reference bitline on one side thereof, a sense amplifier array having a plurality of sense amplifiers for sensing data on the bitlines and the reference bitlines in the cell array, a wordline and plateline driver for selective application of driving signals to the wordlines and the platelines, and a switching part for selective turning on/off of the bitlines, the reference bitlines, and the input/output nodes on the sense amplifier array, whereby improving a chip operation performance and a lifetime.

The present invention can be achieved in parts or in a whole by a ferroelectric memory having a plurality of bitlines, a plurality of wordlines and plate lines formed in a direction crossing the bitlines, and a reference bitline on one side of the plurality of bitlines, the circuit comprising a main cell array having a plurality of main cells, each main cell being coupled to corresponding wordline, plateline and bitline; a reference cell array having a plurality of reference cells, each reference cell being coupled to corresponding wordline, plateline and reference bitline; a sense amplifier array having a plurality of sense amplifiers for sensing data on the bitlines and the reference bitlines; a driver for providing driving signals to the wordlines and the platelines; and a switching unit for selective connection of the bitlines and the reference bitline to input/output nodes and reference nodes, respectively, on the sense amplifier array.

The present invention can be achieved in parts or in a whole by a nonvolatile ferroelectric memory, comprising: a first main cell block having a plurality of bitlines, a plurality of wordlines and platelines formed in a direction crossing the bitlines, and a main cell at a corresponding crossing point of the bitlines with the wordlines and the platelines; a first reference cell block on one side of the first main cell block, the first reference cell block having a reference bitline formed in a direction crossing the wordlines and the platelines and a reference cell on a corresponding crossing point of the reference bitline with the wordlines and the platelines; a first sense amplifier block having a plurality of sense amplifiers each sense amplifier having a bitline input/output node connected to the bitline for sensing a data on a corresponding bitline and a reference bitline input/output node connected to the reference bitline for sensing a data on the reference bitline; a first switching unit for selective connection of the bitline to the bitline input/output node on each of the sense amplifiers in response to a first control signal; a second switching unit for selective connection of the reference bitline to the reference input/output node on each of the sense amplifiers in response to a second control signal; and a pull-up transistor for pulling-up a level of the reference bitline to a level of a power supply voltage in response to a third control signal.

The present invention can be achieved in parts or in a whole by a nonvolatile ferroelectric memory comprising: a first main cell block having a plurality of bitlines, a plurality of wordlines and platelines formed in a direction crossing the bitlines, and a main cell at a corresponding crossing point of the bitlines with the wordlines and the platelines; a first reference cell block on one side of the first main cell block, the first reference cell block having first and second reference bitlines formed in a direction crossing the wordlines and the platelines and a reference cell on a corresponding crossing point of the first and second reference bitlines with the wordlines and the platelines; a first lower sense amplifier block having a plurality of sense amplifiers, each sense amplifier with a bitline input/output node connected to an odd numbered bitline for sensing a data on the odd numbered bitline and a reference bitline input/output node connected to the first reference bitline for sensing a data on the first reference bitline; a first upper sense amplifier block having a plurality of sense amplifiers, each sense amplifier with a bitline input/output node connected to an even numbered bitline for sensing a data on the even numbered bitline and a reference bitline input/output node connected to the second reference bitline for sensing a data on the second reference bitline; a first switching unit for selective connection of the odd numbered bitlines to the bitline input/output nodes on the sense amplifiers in the first lower sense amplifier block; a second switching unit for selective connection of the reference bitline to the reference bitline input/output node on each of the sense amplifiers in the first lower sense amplifier block; a third switching unit for selective connection of the even numbered bitlines to the bitline input/output nodes on the sense amplifiers in the first upper sense amplifier block; a fourth switching unit for selective connection of the reference bitline to the reference bitline input/output node on each of the sense amplifiers in the first upper sense amplifier block; and first and second pull-up transistors for pulling-up levels of the first and second reference bitlines to a level of a power supply voltage, respectively.

The present invention can be achieved in parts or in a whole by a nonvolatile ferroelectric memory comprising: a first main cell block having a plurality of bitlines, a plurality of wordlines and platelines formed in a direction crossing the bitlines, and a main cell at every second crossing point of the bitlines with the wordlines and the platelines; a first reference cell block on one side of the first main cell block, the first reference cell block having first and second reference bitlines formed in a direction crossing the wordlines and the platelines and a reference cell at every second crossing point of the first and second reference bitlines with the wordlines and the platelines; a first sense amplifier block having a plurality of sense amplifiers, each sense amplifier having a bitline input/output node connected to a bitline in the first main cell block and an odd numbered reference bitline input/output node connected to the first reference bitline and an even numbered reference bitline input/output node connected to the second reference bitline; a first switching unit for selective connection of the bitlines to the bitline input/output nodes on the sense amplifiers; a second switching unit for selective connection of the first and second reference bitlines to the corresponding even and odd reference bitline input/output nodes on the sense amplifiers; and pull-up transistors for pulling-up levels of the first and second reference bitlines to a level of a power supply voltage, respectively.

The present invention can be achieved in parts or in a whole by a nonvolatile ferroelectric memory comprising: a first main cell block having a plurality of bitlines, a plurality of wordlines and platelines formed in a direction crossing the bitlines, and a main cell at every second crossing point of the bitlines with the wordlines and the platelines; a first reference cell block on one side of the first main cell block, the first reference cell block having first and second reference bitlines formed in a direction crossing the wordlines and the platelines and a reference cell on every second crossing point of the first and second reference bitlines with the wordlines and the platelines; a first lower sense amplifier block having a plurality of sense amplifiers, each sense amplifier having a bitline input/output node connected to an odd numbered bitline for sensing a data on the odd numbered bitline and a reference bitline input/output node connected to the first reference bitline for sensing a data on the first reference bitline; a first upper sense amplifier block having a plurality of sense amplifiers, each sense amplifier having a bitline input/output node connected to an even numbered bitline for sensing a data on the even numbered bitline and a reference bitline input/output node connected to the second reference bitline for sensing a data on the second reference bitline; a first switching unit for selective connection of the odd numbered bitlines to the bitline input/output nodes on the sense amplifiers in the first lower sense amplifier block; a second switching unit for selective connection of the first reference bitline to the reference bitline input/output node on each of the sense amplifiers in the first lower sense amplifier block; a third switching unit for selective connection of the even numbered bitlines to the bitline input/output nodes on the sense amplifiers in the first upper sense amplifier block; a fourth switching unit for selective connection of the second reference bitline to the reference bitline input/output node on each of the sense amplifiers in the first upper sense amplifier block; and pull-up transistors for pulling-up levels of the first and second reference bitlines to a level of a power supply voltage, respectively.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
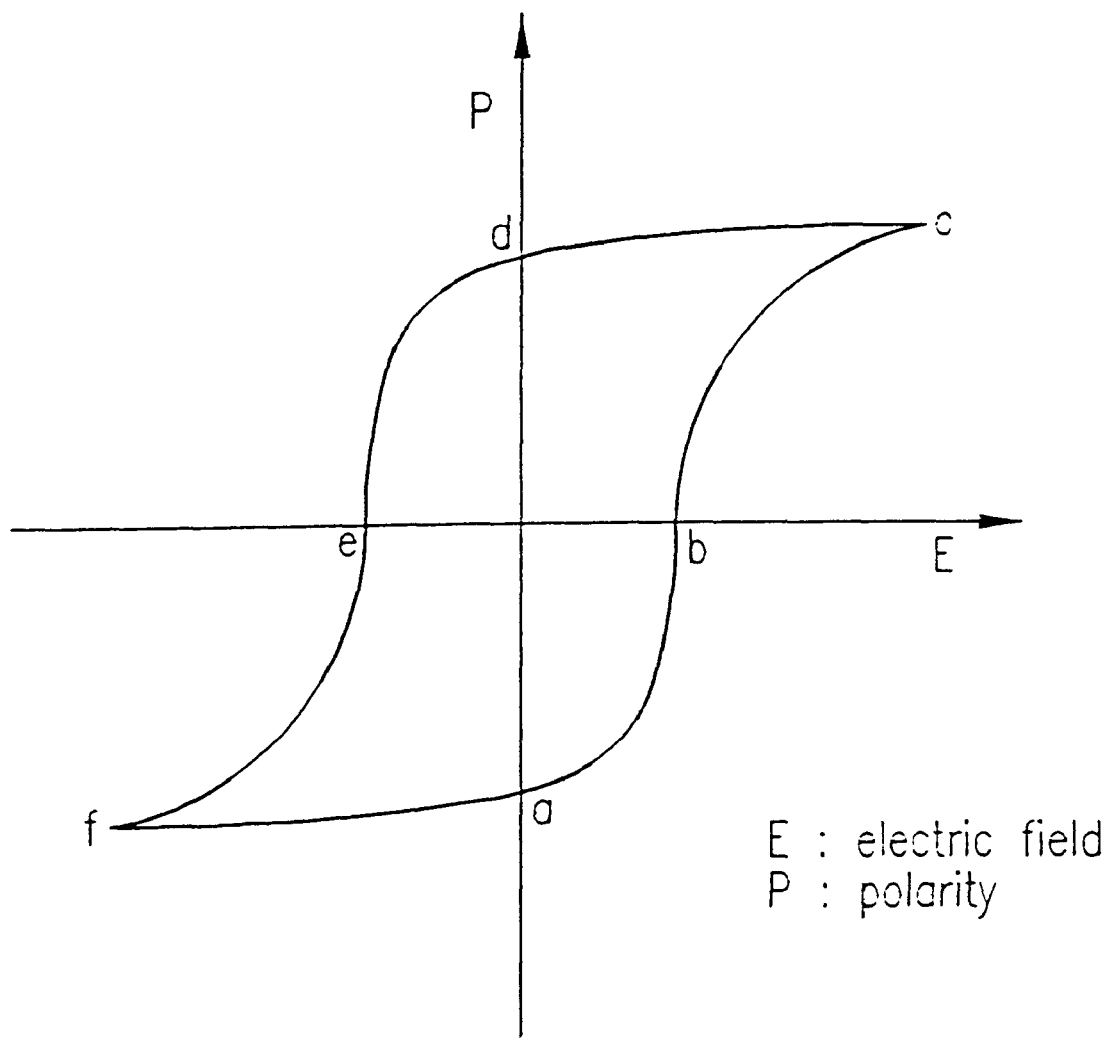
FIG. 1 illustrates a hysteresis loop of a ferroelectric substance.
Figure 2:
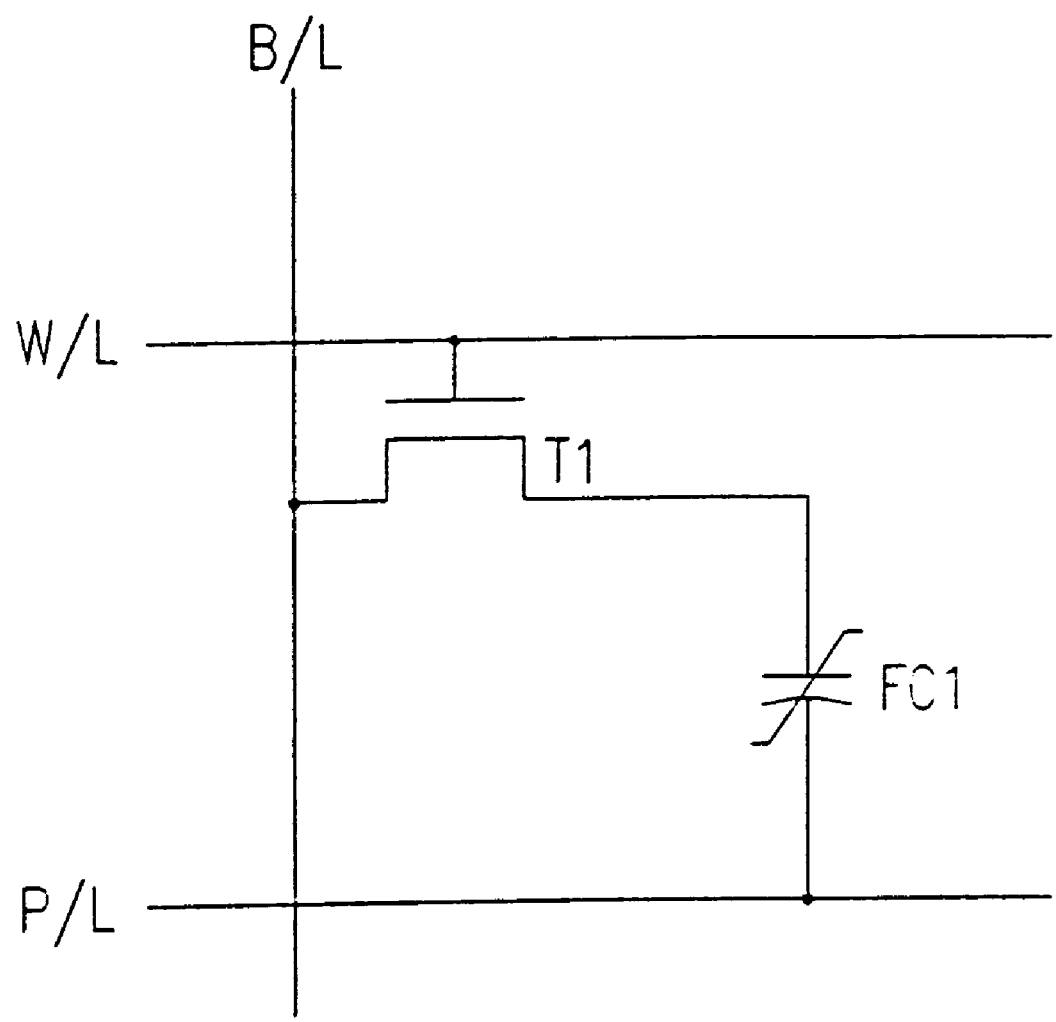
FIG. 2 illustrates a unit cell in a background art nonvolatile ferroelectric memory.
Figure 3A:
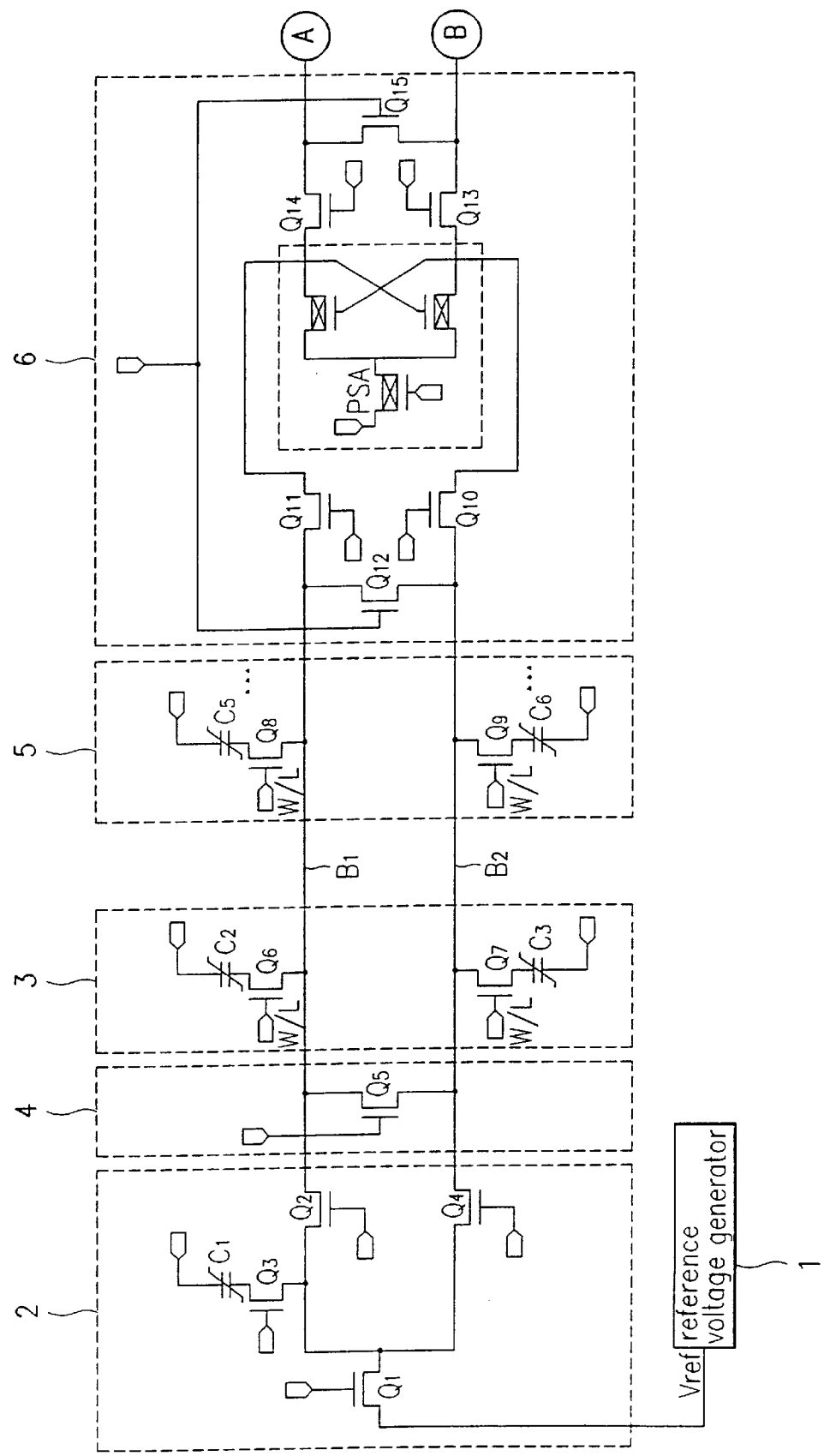
FIGS. 3a and 3b together illustrate a background art circuit for driving a nonvolatile ferroelectric memory.
Figure 3B:
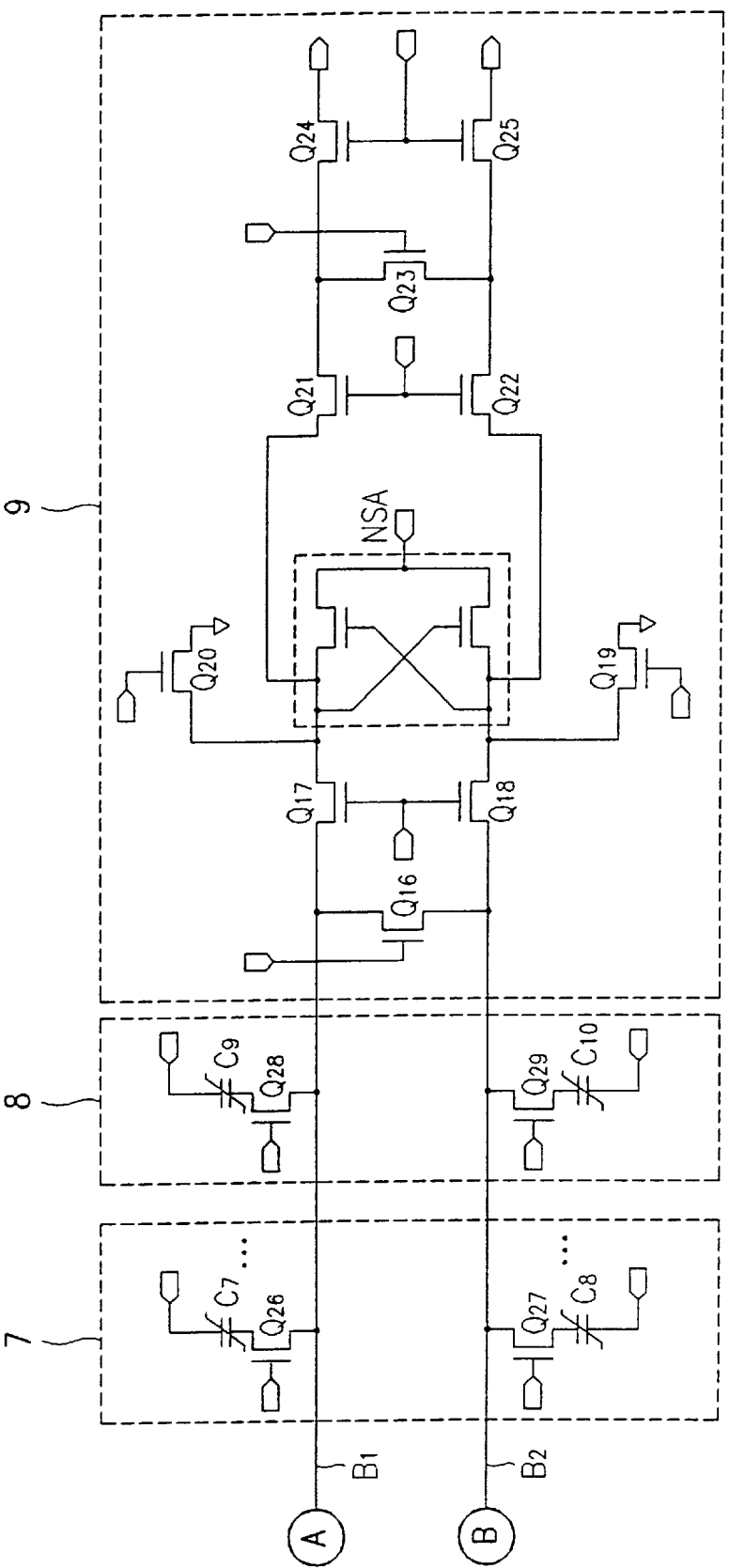
Figure 4:
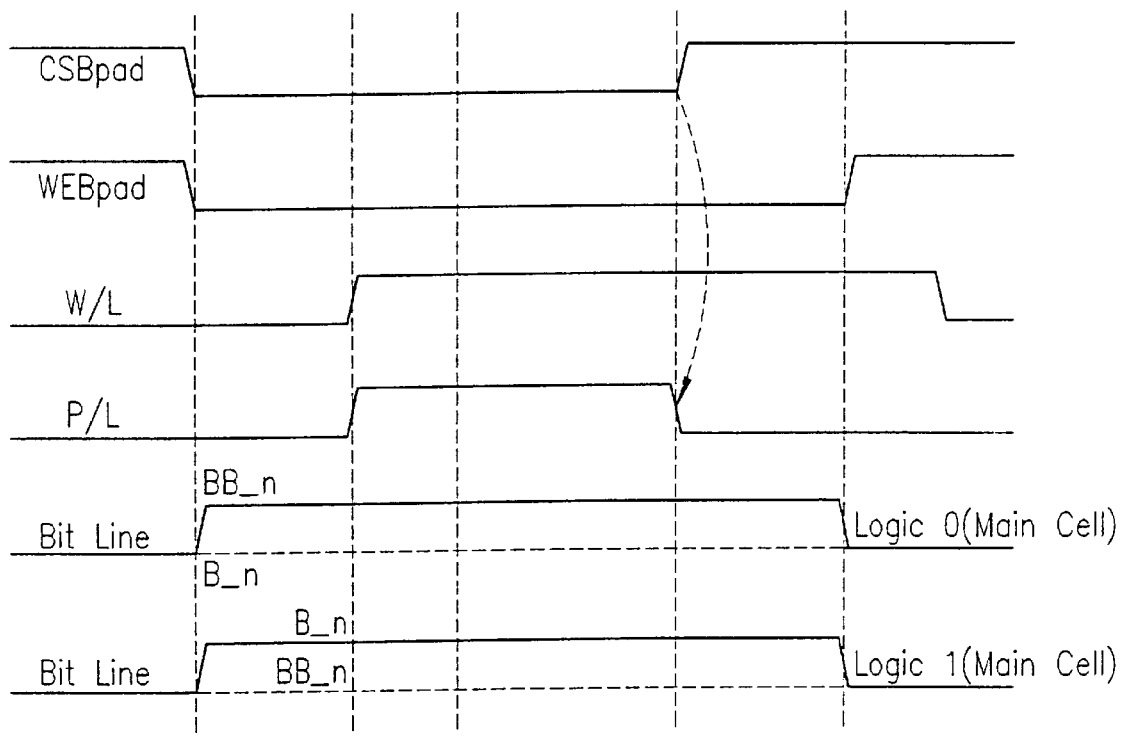
FIG. 4 illustrates a timing diagram showing a write mode of the background art nonvolatile ferroelectric memory.
Figure 5:
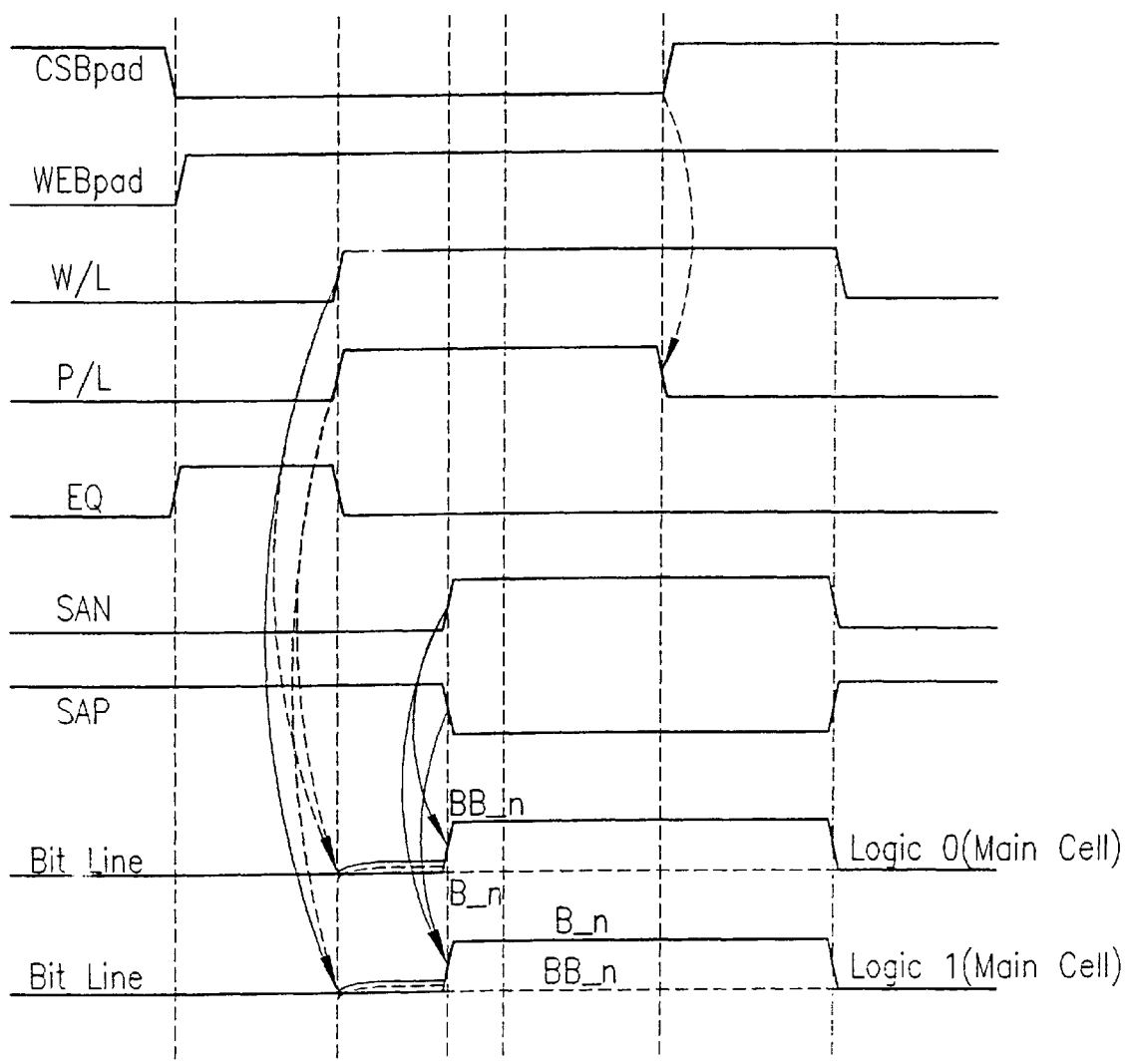
FIG. 5 illustrates a timing diagram showing a read mode of the background art nonvolatile ferroelectric memory.
Figure 6:
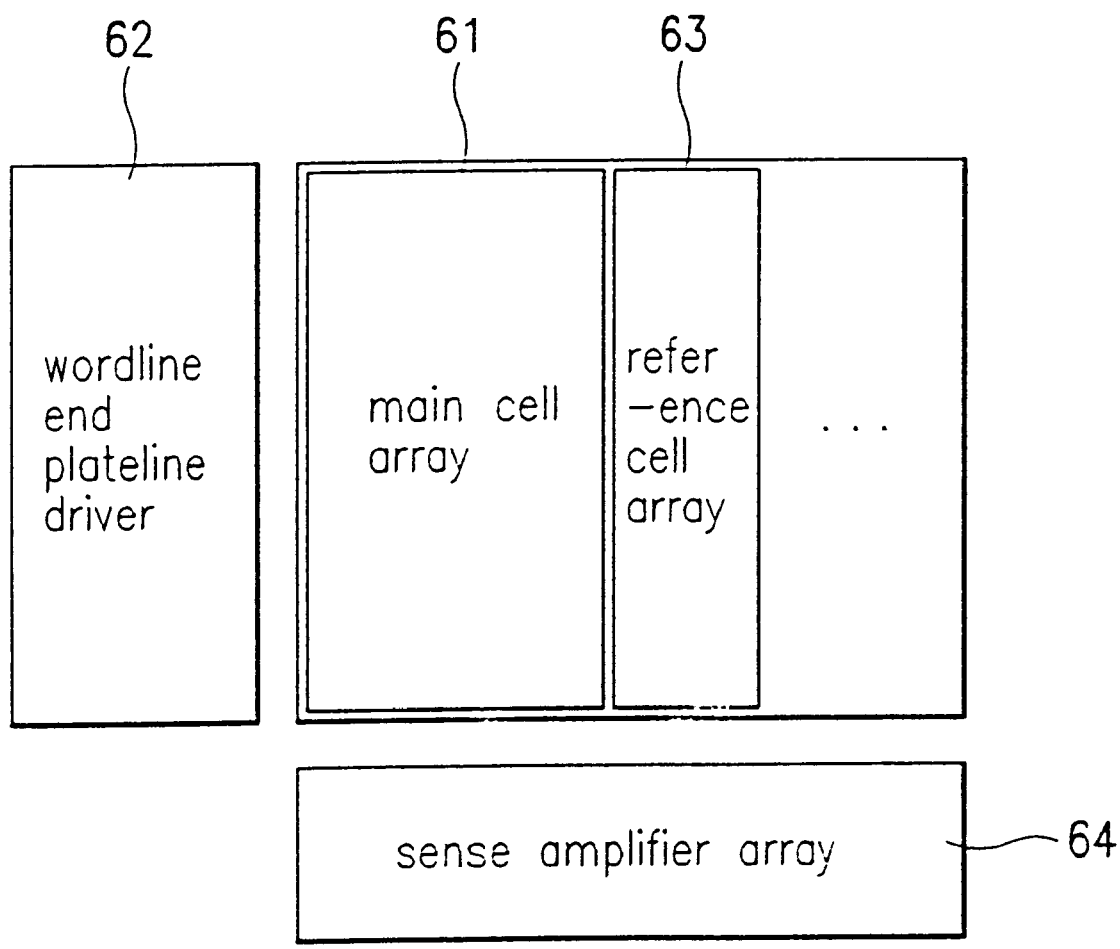
FIG. 6 illustrates a block diagram of a circuit for driving a nonvolatile ferroelectric memory in accordance with a first preferred embodiment of the present invention.

FIG. 6 illustrates a block diagram of a circuit for driving a nonvolatile ferroelectric memory in accordance with a first preferred embodiment of the present invention. The circuit for driving a nonvolatile ferroelectric memory in accordance with a first preferred embodiment of the present invention includes a main cell array 61, a wordline and plateline driver 62 on one side of the main cell array 61, a reference cell array 63 on the other side of the main cell array 61, and a sense amplifier array 64 on another side of the main cell array 61.

Figure 7:
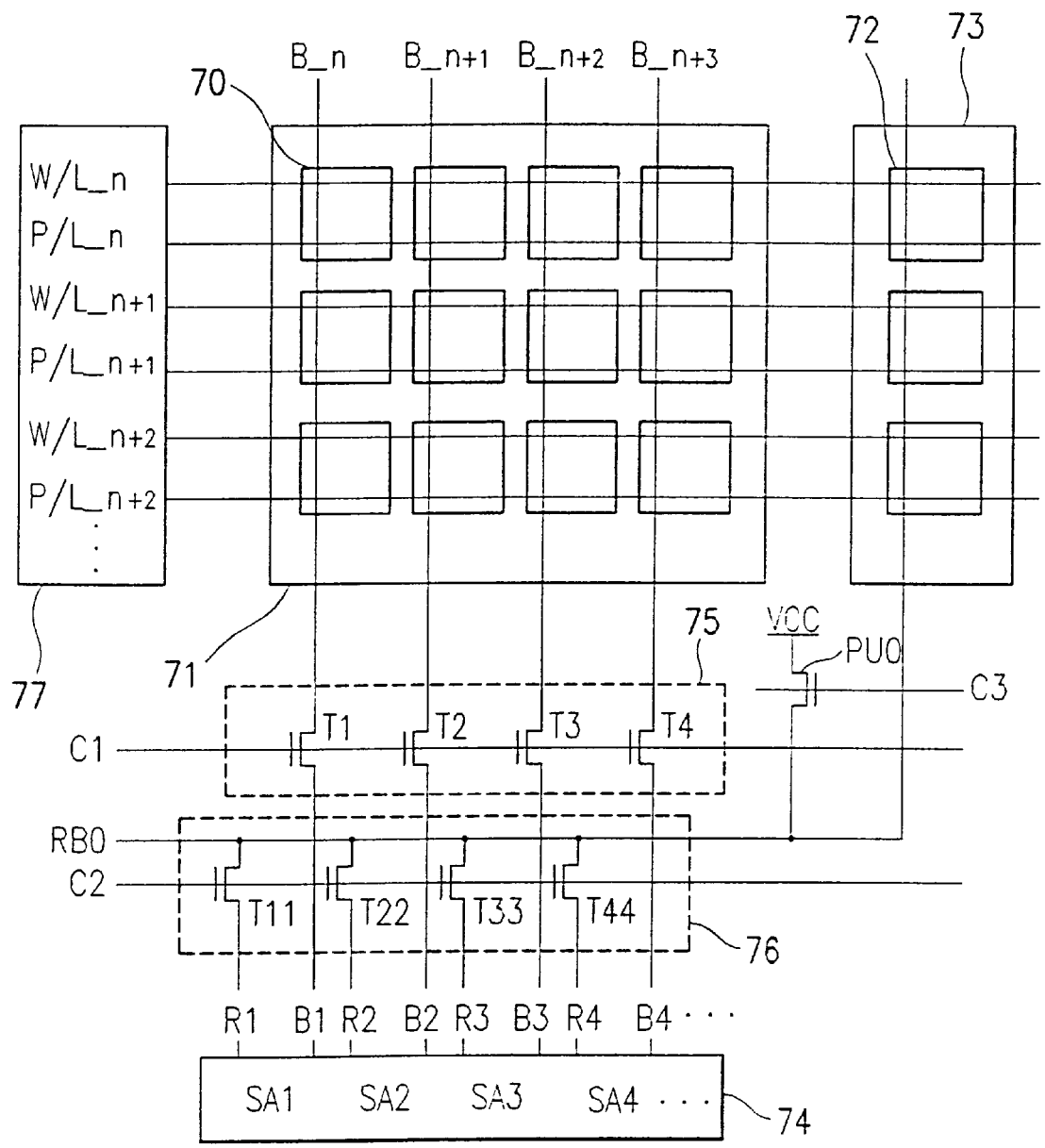
FIG. 7 illustrates a circuit diagram of a circuit for driving a nonvolatile ferroelectric memory in accordance with a first preferred embodiment of the present invention.

FIG. 7 illustrates in more detail a circuit for driving a nonvolatile ferroelectric memory in accordance with a first preferred embodiment of the present invention. The circuit shown in FIG. 7 may be repeated to obtain a system shown in FIG. 6. A first main block 71 has a plurality of wordlines W/L_n, W/L_n+2, W/L_n+3, etc., arranged in one direction at fixed intervals, a wordline P/L_n, P/L_n+1, P/L_n+2, P/L_n+3, etc., arranged between every adjacent wordlines, a plurality of bitlines B_n, B_n+1, B_n+2, B_n+3, etc., arranged in one direction crossing the wordlines and the platelines at fixed intervals, and main cells 70, each being formed at a crossing point of each of the bitlines with the wordlines and the platelines.

A first reference cell block 73 has a reference bitline RB0 formed on one side of the main cell block 71 in a direction crossing the wordlines and the platelines and reference cells 72, each being formed at a crossing point of the reference bitline with the wordlines and the platelines. A first sense amplifier block 74 has a plurality of sense amplifiers SA1, SA2, SA3, SA4, etc., each with a bitline input/output node B1, B2, B3, B4, etc., connected to one of the bitlines for sensing a data on the bitline and a reference bitline input/output node R1, R2, R3, R4, etc., connected to the reference bitline RB0 for sensing a data on the reference bitline.

The circuit may further include a first switching unit 75 having transistors T1, T2, T3, T4, etc., for selective connection of the bitlines to the bitline input/output nodes B1, B2, B3, B4, etc., on each of the sense amplifiers in response to a first control signal C1. The circuit may further include a second switching unit 76 having transistors T11, T22, T33, T44, etc., for selective connection of the reference bitline to the reference bitline input/output nodes R1, R2, R3, R4, etc., on each of the sense amplifiers in response to a second control signal C2, and a pull-up transistor PU0 for pulling-up a level of the reference bitline RB0 to a level of a power supply voltage in response to a third control signal C3. The first and second switching units 75 and 76 may include NMOS transistors or PMOS transistors.

A plural times of repetitive arrangement of the first main block 71 and the first reference cell block 73 as a pair forms one cell array, and a plural times of repetitive arrangement of the first sense amplifier block 74 forms one sense amplifier array. Though the reference bitline is provided after four bitlines are provided in FIG. 7, the reference bitline may be provided after every two or more than two, ie., after every plural bitlines with flexibility. A wordline and plateline driver 77 applies a signal to the wordlines and the platelines. In this first embodiment, the cell array has a memory cell at every crossing of the bitlines with the wordlines and the platelines.

The operation of the circuit for driving a nonvolatile ferroelectric memory in accordance with a first embodiment of the present invention is as follows. Referring to FIG. 7, when the first control signal C1 is enabled to high, all the transistors T1, T2, T3, T4, etc., in the first switching part 75 are turned on, electrically connecting the bitlines B_n, B_n+1, B_n+2, B_n+3, etc., in the first main cell block 71 to the bitline input/output nodes B1, B2, B3, B4, etc., in the first sense amplifier block 74, respectively. When the second control signal C2 is enabled to high, the transistors T11, T22, T33, T44, etc., in the second switching unit 76 is turned on, electrically connecting the reference bitline RB0 to the reference bitline input/output node R1,R2,R3,R4, etc., on the first sense amplifier block 74.

Upon application of high signals from the wordline and plateline driver 77 to the wordline and the plateline under a state the first control signal C1 and the second control signal C2 are thus enabled, a data stored in the main cell 70 is provided to the bitline input/output node B1, B2, B3, B4, etc., in the first sense amplifier block 74 though the bitline B_n, B_n+1, B_n+2, B_n+3, etc. A data in the reference cell 72 is provided to the reference bitline input/output node R1, R2, R3, R4, etc., on the first sense amplifier block 74 through the reference bitline RB0. If the data in the main cell 70 and reference cell 72 are provided to the bitline and the reference bitline adequately, the first control signal C1 and the second control signal C2 are disabled, to turn off all the transistors in the first and second switching units 75 and 76.

Thereafter, the sense amplifier SA1, SA2, SA3, SA4, etc., in the first sense amplifier block 74 amplifies very low voltage provided to the bitline input/output node and the reference bitline input/output node. Upon completion of the amplification, the first control signal C1 is enabled to high again, to provide the data amplified in the sense amplifier to the bitline through the first switching part 75. In order to store the data "1" canceled in the reference cell 72 again, the third control signal C3 is enabled, pulling-up the reference bitline level to the power supply voltage Vcc level. The plateline is brought to low to store the data in the reference cell 72 and the data in the main cell 70, both are canceled, again.

Figure 8:
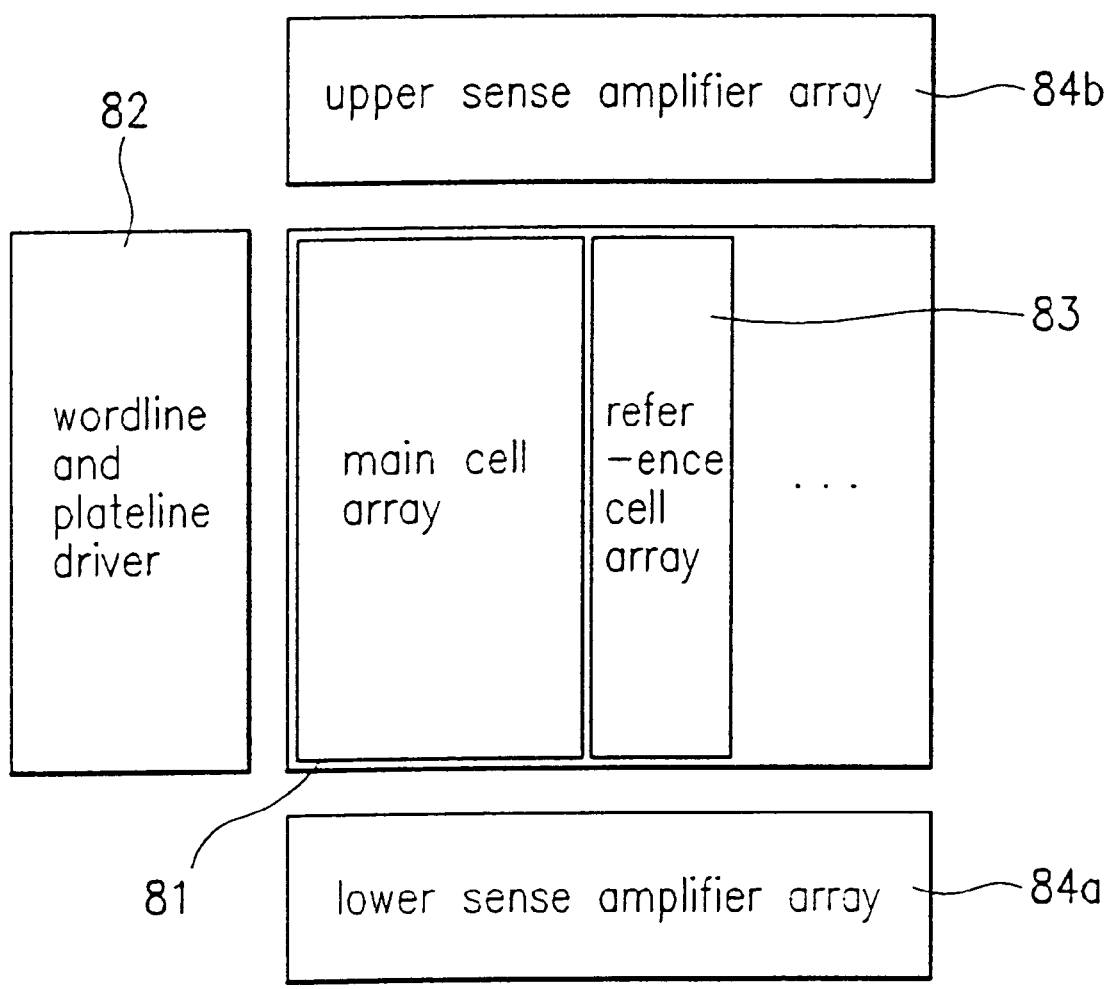
FIG. 8 illustrates a block diagram of a circuit for driving a nonvolatile ferroelectric memory in accordance with a second preferred embodiment of the present invention.

FIG. 8 illustrates a block diagram of a circuit for driving a nonvolatile ferroelectric memory in accordance with a second preferred embodiment of the present invention. The circuit includes a main cell array 81, a wordline and plateline driver 82 on one side of the main cell array 81, a reference cell array 83 on the other side of the main cell array 81, a low sense amplifier array 84a on a lower side of the main cell array 81, and an upper sense amplifier array 84b on an upper side of the main cell array 81.

Figure 9:
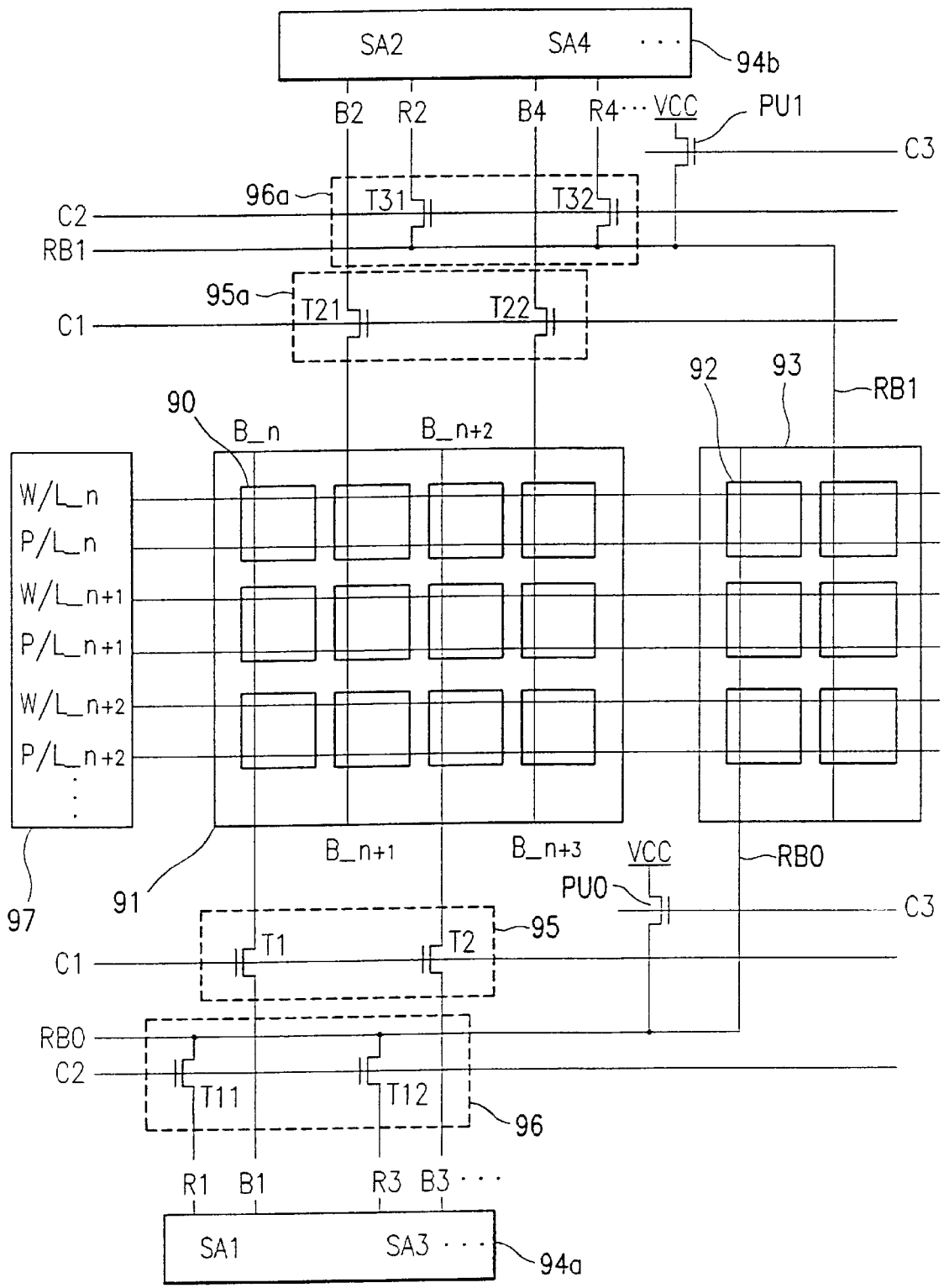
FIG. 9 illustrates a circuit diagram of a circuit for driving a nonvolatile ferroelectric memory in accordance with a second preferred embodiment of the present invention.

FIG. 9 illustrates in more detail the circuit of FIG. 8. The circuit shown in FIG. 9 may be repeated to obtain a system shown in FIG. 8. The circuit includes a first main block 91 having a plurality of wordlines W/L_n, W/L_n+1, W/L_n+2, W/L_n+3, etc., arranged in one direction at fixed intervals, a wordline P/L_n, P/L_n+1, P/L_n+2, P/L_n+3, etc., arranged between every adjacent wordlines, a plurality of bitlines B_n, B_n+1, B_{n+2}, B_n+3, etc., arranged in one direction crossing the wordlines and the platelines at fixed intervals, and main cells 90, each being formed at a crossing point of each of the bitlines with the wordlines and the platelines.

First reference cell block 93 having first and second reference bitlines RB0 and RB1 is formed on sides of the main cell 91 in a direction crossing the wordlines and the platelines and reference cells 92, each being formed at crossing points of the first and second reference bitlines RB0 and RB1 with the wordlines and the platelines. A first lower sense amplifier block 94a having a plurality of sense amplifiers, SA1, SA3, etc., each with a bitline input/output node B1, B3, etc., connected to odd numbered one of the bitlines, senses a data on the bitline and senses a data on a reference bitline input/output node R1, R3, etc., connected to the first reference bitline RB0. A first upper sense amplifier block 94b having a plurality of sense amplifiers SA2, SA4, etc., each with a bitline input/output node B2, B4, etc., connected to even numbered one of the bitlines senses a data on the bitline and senses a data on a reference bitline input/output node R2, R4, etc., connected to the second reference bitline RB1.

The circuit may further includes a first switching unit 95 having transistors T1, T2, etc., for selective connection of odd numbered bitlines to the bitline input/output nodes B1, B3, etc., on the sense amplifiers SA1, SA3, etc., in the first lower sense amplifier block 94a in response to a first control signal C1. A second switching unit 96 having transistors T11, T12, etc., may be included for selective connection of the reference bitline RB0 to the reference bitline input/output nodes R1, R3, etc., on the sense amplifiers SA1, SA3, etc., in the first lower sense amplifier block 94a in a response to a second control signal C2. A third switching unit 95a having transistors T21, T22, etc., may be included for selective connection of even numbered bitlines to the bitline input/output nodes B2, B4, etc., on the sense amplifiers SA2, SA4, etc., in the upper sense amplifier block 94b in response to a first control signal C1. A fourth switching unit 96 having transistors T31, T32,etc., may be included for selective connection of the reference bitline RB1 to the reference bitline input/output nodes R2, R4, etc., on the sense amplifiers SA2, SA4, etc., in the first upper sense amplifier block 94b in response to a second control signal C2.

Pull-up transistors PU0 and PU1 may be included for pulling-up levels of the reference bitlines RB0 and RB1 to a level of a power supply voltage in response to a third control signal C3, respectively. The first to fourth switching units 95, 96, 95a and 96 a may include NMOS transistors or PMOS transistors. Though the two reference bitlines RB0 and RB1 are provided after four bitlines connected to the upper and low sense amplifiers 94a and 94b are provided in FIG. 9, the reference bitlines RB0 and RB1 may be provided after every even numbered bitlines of 6, 8, 10, etc.

Figure 10:
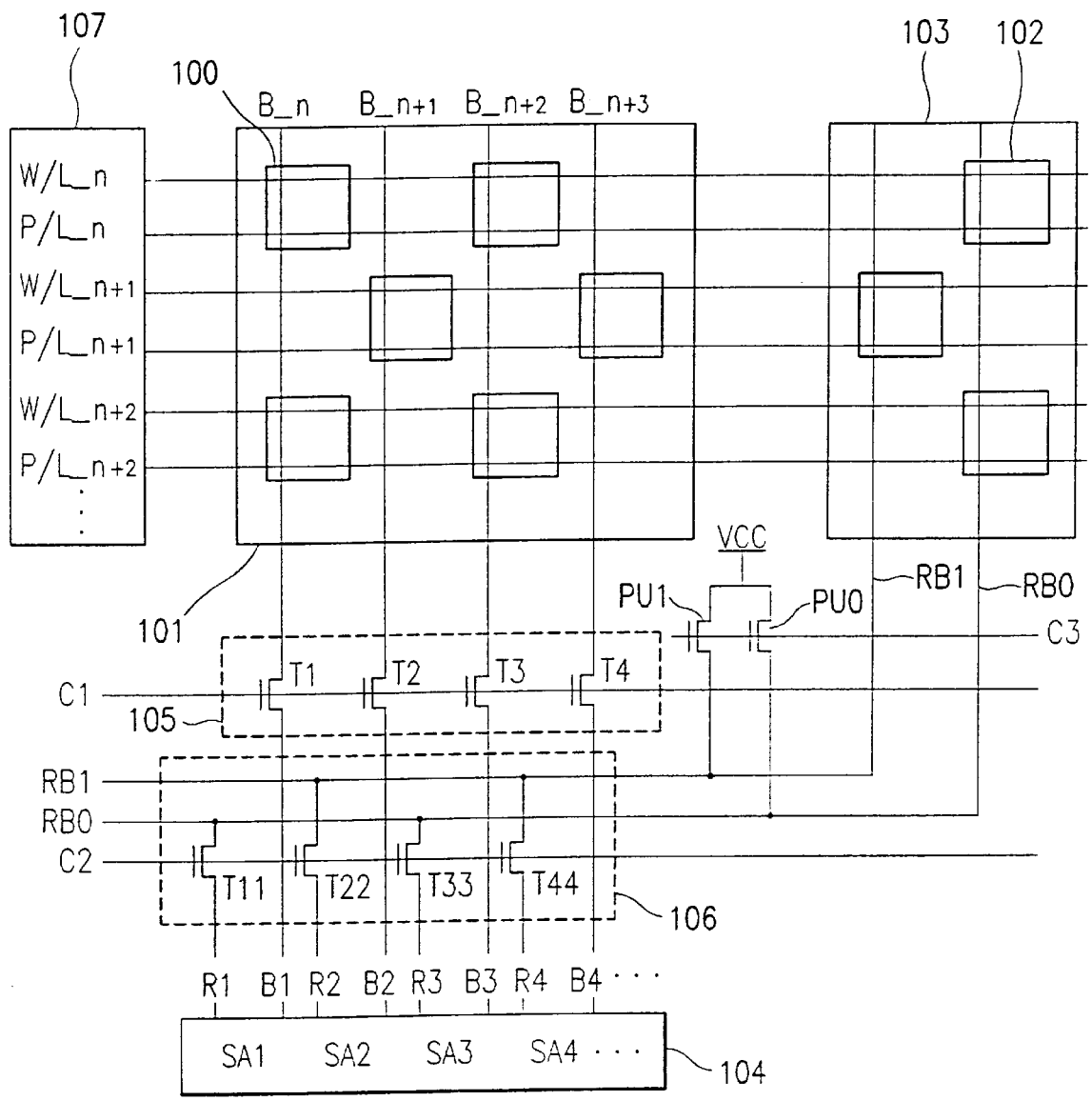
FIG. 10 illustrates a circuit diagram of a circuit for driving a nonvolatile ferroelectric memory in accordance with a third preferred embodiment of the present invention.

FIG. 10 illustrates a circuit for driving a nonvolatile ferroelectric memory in accordance with a third preferred embodiment of the present invention. The aforementioned first and second embodiments memory cells in the cell array disposed at every crossing point of bitlines with the wordline and platelines. However, in this third embodiment, the memory cells in the cell array are arranged in a folded bit line structure, i.e., a plurality of wordlines are formed in one direction at fixed intervals and a plurality of platelines are formed parallel to the wordlines between adjacent wordlines. A plurality of bitlines are formed in one direction crossing the wordlines and the bitlines at fixed intervals.

A unit memory cell is formed, not every crossing point of the bitlines with the wordline and the platelines, but at every second wordline with respect to a bitline. That is, the cell array in the third embodiment has a form of folded bitline in which memory cells on adjacent two bitlines are arranged in a zigzag form and similarly, reference cells on the first reference bitline and reference cells on the second reference bitline are arranged in a zigzag form. When the cell array has the form of folded bitline, the reference bitline requires two columns, i.e., the first reference bitline RB0 and the second reference bitline RB1, causing an arrangement of memory cells on an odd numbered bitline and an arrangement of reference cell on the second reference bitline RB1 the same and an arrangement of memory cells on an even numbered bitline and an arrangement of reference cell on the first reference bitline RB0 the same.

The circuit for driving a nonvolatile ferroelectric memory in accordance with a third preferred embodiment of the present invention includes a first main block 101 having a plurality or wordlines W/L_n, W/L_n+1, W/L_n+2, W/L_n+3, etc., arranged in one direction at fixed intervals, a wordline P/L_n, P/L_n+1, P/L_n+2, P/L_n+3, etc., arranged between every adjacent wordlines, a plurality of bitlines B_n, B_n+1, B_n+2, B_n+3, etc., arranged in one direction crossing the wordlines and the platelines at fixed intervals, and main cells 100.

Each of the main cells is formed at every second crossing point of each of the bitlines with the wordlines and the platelines. A first reference cell block 103 having first and second reference bitlines RB0 and RB1 is formed on one side of the main cell block 101 in a direction crossing the wordlines and the platelines and reference cells 102 are formed at every second crossing point of the first and second reference bitlines with the wordlines and the platelines. A first sense amplifier block 104 has a plurality of sense amplifiers SA1, SA2, SA3, SA4, etc., with bitline input/output nodes B1, B2, B3, B4, etc., connected to the bitlines in the first main cell block 101 and odd numbered reference bitline input/output nodes R1, R3, etc., connected to the first reference bitline RB0 and even numbered reference bitline input/output nodes R2, R4, etc., connected to the first reference bitline RB1.

The circuit may further includes a first switching unit 105 having transistors T1, T2, T3, T4, etc., for selective connection of the bitlines to the bitline input/output nodes B1, B2, B3, B4, etc., on each of the sense amplifiers in response to a first control signal C1. A second switching unit 106 may be included having transistors T11, T22, T33, T44, etc., for selective connection of the reference bitline RB0 to the reference bitline input/output nodes R1, R2, R3, R4, etc., on each of the sense amplifiers in response to a second control signal C2. Pull-up transistors PU0 and PU1 may be included for pulling-up levels of the reference bitlines RB0 and RB1 to a level of a power supply voltage in response to a third control signal C4 respectively.

The first and second switching units 105 and 106 may respectively include NMOS transistors or PMOS transistors. A plural times of repetitive arrangement of the first main block 100 and the first reference cell block 103 forms one cell array, and a plural times of repetitive arrangement of the first sense amplifier block 104 forms one sense amplifier array. Though the reference bitlines are provided after four bitlines are illustrated in FIG. 10, the reference bitlines may be provided after every two or more than two, i.e., after every plural bitlines for flexibility.

Figure 11:
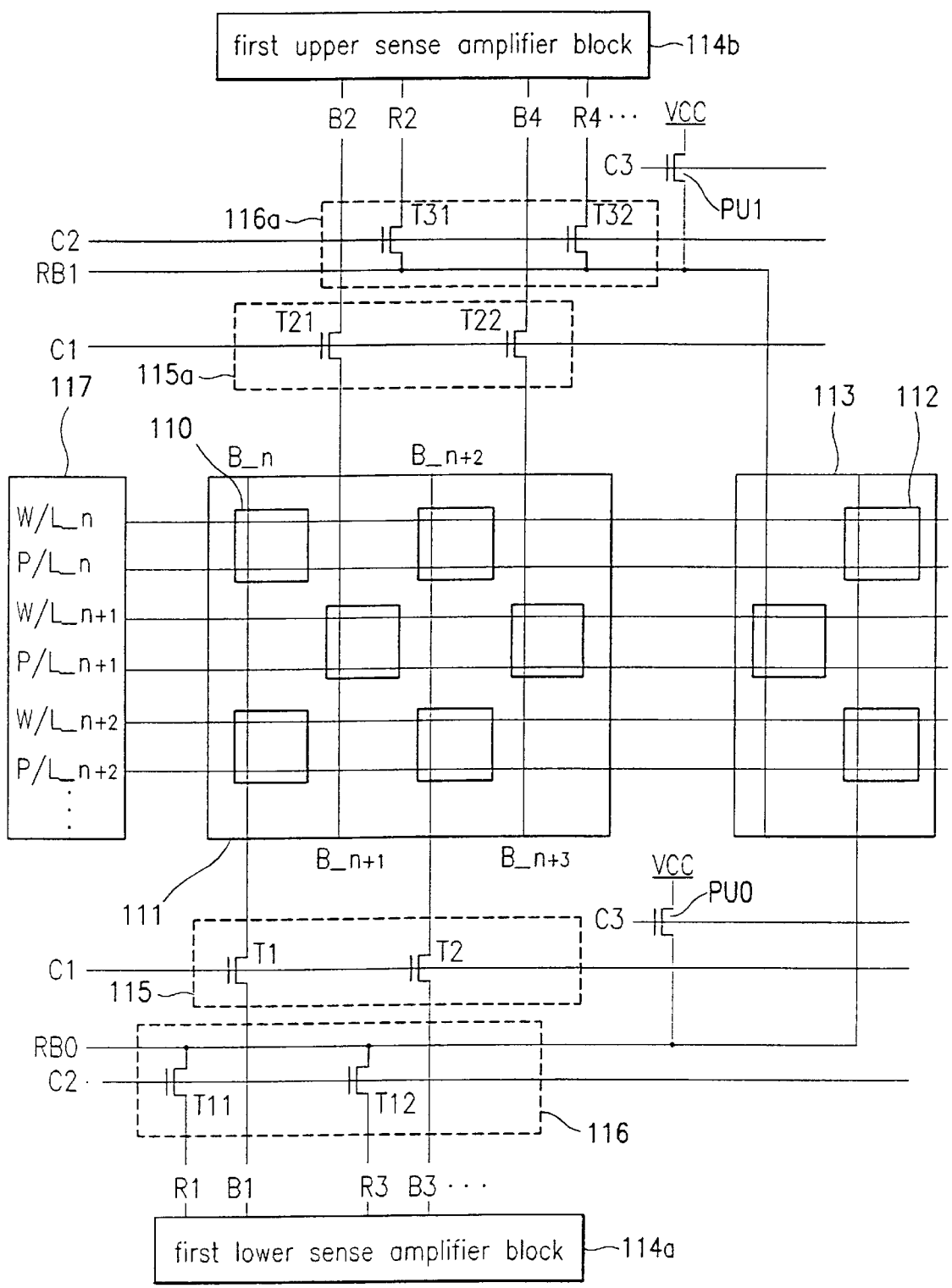
FIG. 11 illustrates a circuit diagram of a circuit for driving a nonvolatile ferroelectric memory in accordance with a fourth preferred embodiment of the present invention.

FIG. 11 illustrates a circuit for driving a nonvolatile ferroelectric memory in accordance with a fourth preferred embodiment of the present invention. Similar to the third embodiment, the memory cells in the cell array of the fourth embodiment have a form of folded bitline. The circuit includes a first main block 111 having a plurality of wordlines W/L_n, W/L_n+1, W/L_n+2, W/L _n+, etc., arranged in one direction at fixed intervals, a plurality of platelines P/L_n, P/L_n+1, P/L_n+2, P/L_n+, etc., arranged between every adjacent wordlines, and a plurality of bitlines B_n, B_n+1, B_n+2, B_n+3, etc., arranged in one direction crossing the wordlines and the platelines at fixed intervals.

A main cell 110 is formed at every second crossing point of the bitlines with the wordlines and the platelines. A first reference cell block 113 has first and second reference bitlines RB0 and RB1, each formed on one side of the main cell block 111 in a direction crossing the wordlines and the platelines. Each reference cell 112 is formed at every second crossing point of the first and second refernce bitlines RB0 and RB1 with the wordlines and the platelines.

A first lower sense amplifier block 114a has a plurality of sense amplifiers SA1, SA3, etc., each with a bitline input/output node B1, B3, etc., connected to odd numbered one of the bitlines for sensing a data on the bitline, and reference bitline input/output nodes R1, R3, etc., connected to the first reference bitline RB0 for sensing a data on the reference bitline. A first upper sense amplifier block 114b has a plurality of sense amplifiers SA2, SA4, etc., each with a bitline input/output node B2, B4, etc., connected to even numbered one of the bitlines for sensing a data on the bitline, and reference bitline input/output nodes R2, R4, etc., connected to the second reference bitline RB1 for sensing a data on the reference bitline.

The circuit may further includes a first switching unit 115 has transistors T1, T2, etc., for selective connection of odd numbered bitlines to the bitline input/output nodes B1, B3, etc., on the sense amplifiers SA1, SA3, in the lower sense amplifier block 114a in response to a first control signal C1. A second switching unit 116 has transistors T11, T12,etc., for selective connection of the first reference bitline RB0 to the reference bitline input/output nodes R1, R3, etc., on the sense amplifiers SA1, SA3, etc., in the first lower sense amplifier block 114a in response to a second control signal C2. A third switching unit 115a has transistors T21, T22, etc., for selective connection of even numbered bitlines to the bitline input/output nodes B2, B4, etc., on the sense amplifiers SA2, SA4, etc., in the upper sense amplifier block 114b in response to a first control signal C1. A fourth switching unit 116a has transistors T31, T32, etc., for selective connection of the reference bitline RB1 to the reference bitline input/output nodes R2, R4, etc., on the sense amplifiers SA2, SA4, etc., in the first upper sense amplifier block 114b in response to a second control signal C2.

Pull-up transistor PU0 and PU1 may be included for pulling-up levels of the reference bitlines RB0 and RB1 to a level of a power supply voltage in response to a third control signal C3, respectively. The first to fourth switching units 115, 116, 115a and 116a may include NMOS transistors or PMOS transistors, respectively. Though the two reference bitlines RB0 and RB1 are provided after four bitlines connected to the upper and lower sense amplifiers 114b and 114a are provided in FIG. 11, the reference bitlines RB0 and RB1 may be provided after every even numbered bitlines of 6, 8, 10, etc. A repetitive arrangement of the first main cell block 111 at the first reference cell block 113 may form one cell array, and the first lower and upper sense amplifiers 114a and 114b may form the lower and upper sense amplifier arrays.

The circuit for driving a nonvolatile ferroelectric memory in accordance with various embodiments of the present invention has numerous advantages. For example, the equal degradation of ferroelectric properties between the main cells and reference cells coming from equal chances of access thereto facilitates a relation of voltages induced by the reference cells and the main cells equal, that improves a chip performance and lifetime, and stabilizes a sense amplifier operation and improves an operation speed.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also eqivalent structures.

What is claimed is:

1. A nonvolatile ferroelectric memory comprising: p1 a first main cell block having a plurality of bitlines, a plurality of wordlines and platelines formed in a direction crossing the bitlines, and a main cell at a corresponding crossing point of the bitlines with the wordlines and the platelines;
   a first reference cell block on one side of the first main cell block, the first reference cell block having first and second reference bitlines formed in a direction crossing the wordlines and the platelines and a reference cell on a corresponding crossing point of the first and second reference bitlines with the wordlines and the platelines;
   a first lower sense amplifier block having a plurality of sense amplifiers, each sense amplifier with a bitline input/output node connected to an odd numbered bitline for sensing a data on the odd numbered bitline and a reference bitline input/output node connected to the first reference bitline for sensing a data on the first reference bitline;
   a first upper sense amplifier block having a plurality of sense amplifiers, each sense amplifier with a bitline input/output node connected to an even numbered bitline for sensing a data on the even numbered bitline and a reference bitline input/output node connected to the second reference bitline for sensing a data on the second reference bitline;
   a first switching unit for selective connection of the odd numbered bitlines to the bitline input/output nodes on the sense amplifiers in the first lower sense amplifier block;
   a second switching unit for selective connection of the reference bitline to the reference bitline input/output node on each of the sense amplifiers in the first lower sense amplifier block;
   a third switching unit for selective connection of the even numbered bitlines to the bitline input/output nodes on the sense amplifiers in the first upper sense amplifier block;
   a fourth switching unit for selective connection of the reference bitline to the reference bitline input/output node on each of the sense amplifiers in the first upper sense amplifier block; and
   first and second pull-up transistors for pulling-up levels of the first and second reference bitlines to a level of a power supply voltage, respectively.

2. The nonvolatile ferroelectric memory of claim 1, wherein there are n number of bit lines for each of the first and second reference bitlines formed adjacent to the last bitline, where n is an even number at least equal to 2.

3. The nonvolatile ferroelectric memory of claim 1, wherein the first main cell block and the first reference cell block are repeated to form one cell array and the first upper and lower sense amplifier blocks are repeated to form upper and lower sense amplifier arrays.

4. The nonvolatile ferroelectric memory of claim 1, wherein the first, second, third and fourth switching units include NMOS transistors or PMOS transistors.

5. The nonvolatile ferroelectric memory of claim 1, further comprising a wordline and plateline driver disposed on one side of the first main cell block for applying driving signals to the wordlines and the platelines.

6. A nonvolatile ferroelectric memory comprising:
   a first main cell block having a plurality of bitlines, a plurality of wordlines and platelines formed in a direction crossing the bitlines, and a main cell at every second crossing point of the bitlines with the wordlines and the platelines;
   a first reference cell block on one side of the first main cell block, the first reference cell block having first and second reference bitlines formed in a direction crossing the wordlines and the platelines and a reference cell on every second crossing point of the first and second reference bitlines with the wordlines and the platelines;
   a first lower sense amplifier block having a plurality of sense amplifiers, each sense amplifier having a bitline input/output node connected to an odd numbered bitline for sensing a data on the odd numbered bitline and a reference bitline input/output node connected to the first reference bitline for sensing a data on the first reference bitline;
   a first upper sense amplifier block having a plurality of sense amplifiers, each sense amplifier having a bitline input/output node connected to an even numbered bitline for sensing a data on the even numbered bitline and a reference bitline input/output node connected to the second reference bitline for sensing a data on the second reference bitline;
   a first switching unit for selective connection of the odd numbered bitlines to the bitline input/output nodes on the sense amplifiers in the first lower sense amplifier block;
   a second switching unit for selective connection of the first reference bitline to the reference bitline input/ output node on each of the sense amplifiers in the first lower sense amplifier block;

a third switching unit for selective connection of the even numbered bitlines to the bitline input/output nodes on the sense amplifiers in the first upper sense amplifier block;

a fourth switching unit for selective connection of the second reference bitline to the reference bitline input/output node on each of the sense amplifiers in the first upper sense amplifier block; and pull-up transistors for pulling-up levels of the first and second reference bitlines to a level of a power supply voltage, respectively.

7. The nonvolatile ferroelectric memory of claim 6, wherein there are n number of bitlines, each of the first and second reference bitlines formed adjacent to the last bitline of n number of bit lines, where n is an even number at least equal to 2.

8. The nonvolatile ferroelectric memory of claim 6, wherein the first main cell block and the first reference cell block are repeated to form one cell array, the first lower sense amplifier block are repeated to form one lower sense amplifier array and the first upper sense amplifier block are repeated to form one upper sense amplifier array.

9. A nonvolatile ferroelectric memory comprising:

a first main cell block having a plurality of bitlines, a plurality of wordlines and platelines formed in a direction crossing the bitlines, and a main cell at a corresponding crossing point of the bitlines with the wordlines and the platelines;

a first reference cell block on one side of the first main cell block, the first reference cell block having first and second reference bitlines formed in a direction crossing the wordlines and the platelines and a reference cell on a corresponding crossing point of the first and second reference bitlines with the wordlines and the platelines;

an odd sense amplifier block having a plurality of sense amplifiers, each sense amplifier with a bitline input/output node connected to an odd numbered bitline for sensing a data on the odd numbered bitline and a reference bitline input/output node connected to the first reference bitline for sensing a data on the first reference bitline; and an even sense amplifier block having a plurality of sense amplifiers, each sense amplifier with a bitline input/output node connected to an even numbered bitline for sensing a data on the even numbered bitline and a reference bitline input/output node connected to the second reference bitline for sensing a data on the second reference bitline.

10. The nonvolatile ferroelectric memory of claim 9, further comprising: p1 an odd switching circuit that selectively connects the odd numbered bitlines to the bitline input/output nodes on the sense amplifiers in the odd sense amplifier block and selectively connects the reference bitline to the first reference bitline input/output node on each of the sense amplifiers in the odd sense amplifier block; and an even switching circuit that selectively connects the even numbered bitlines to the bitline input/output nodes on the sense amplifiers in the even sense amplifier block and selectively connects the second bitline to the reference bitline input/output node on each of the sense amplifiers in the even sense amplifier block.

11. The nonvolatile ferroelectric memory of claim 10, wherein the odd switching circuit comprises:

a first switching unit for selective connection of the odd numbered bitlines to the bitline input/output nodes on the sense amplifiers in the odd sense amplifier block; and a second switching unit for selective connection of the first reference bitline to the reference bitline input/output node on each of the sense amplifiers in the odd lower sense amplifier block.

12. The nonvolatile ferroelectric memory of claim 10, wherein the even switching circuit comprises:

a first switching unit for selective connection of the even numbered bitlines to the bitline input/output nodes on the sense amplifiers in the even sense amplifier block; and a second switching unit for selective connection of the second reference bitline to the reference bitline input/output node on each of the sense amplifiers in the even sense amplifier block.

13. The nonvolatile ferroelectric memory of claim 10, further comprising first and second pull-up transistors for pulling-up levels of the first and second reference bitlines to a level of a power supply voltage, respectively.

14. The nonvolatile ferroelectic memory of claim 9, wherein there are n number of bit lines for each of the first and second reference bitlines formed adjacent to the last bitline, where n is an even number at least equal to 2.

15. The nonvolatile ferroelectric memory of claim 9, wherein the first main cell block and the first reference cell block are repeated to form one cell array and the even and odd sense amplifier blocks are repeated to form even and odd sense amplifier arrays.

16. The nonvolatile ferroelectric memory of claim 9, further comprising a wordline and plateline driver disposed on one side of the first main cell block for applying driving signals to the wordlines and the platelines.

17. A nonvolatile ferroelectric memory comrising:

a first main cell block having a plurality of bitlines, a plurality of wordlines and platelines formed in a direction crossing the bitlines, and a main cell at every second crossing point of the bitlines with the wordlines and the platelines;

a first reference cell block on one side of the first main cell block, the first reference cell block having first and second reference bitlines formed in a direction crossing the wordlines and the platelines and a reference cell on every second crossing point of the first and second reference bitlines with the wordlines and the platelines;

an odd sense amplifier block having a plurality of sense amplifiers, each sense amplifier having a bitline input/output node connected to an odd numbered bitline for sensing a data on the odd numbered bitline and a reference bitline input/output node connected to the first reference bitline for sensing a data on the first reference bitline; and an even sense amplifier block having a plurality of sense amplifiers, each sense amplifier having a bitline input/output node connected to an even numbered bitline for sensing a data on the even numbered bitline and a reference bitline input/output node connected to the second reference bitline for sensing a data on the second reference bitline.

18. The nonvolatile ferroelectric memory device of claim 17, further comprising:

an odd switching circuit that selectively connects the odd numbered bitlines to the bitline input/output nodes on the sense amplifiers in the odd sense amplifier block and selectively connects the first reference bitline to the reference bitline input/output node on each of the sense amplifiers in the odd sense amplifier block; and an even switching circuit that selectively connects the even numbered bitlines to the bitline input/output nodes on the sense amplifiers in the even sense amplifier block and selectively connects the second reference bitline to the reference bitline input/output node on each of the sense amplifiers in the even sense amplifier block.

19. The nonvolatile ferroelectric memory device of claim 18, further comprising pull-up transistors for pulling-up levels of the first and second reference bitlines to a level of a power supply voltage, respectively.

20. The nonvolatile ferroelectric memory device of claim 18, wherein said odd switching circuit comprises:

a first switching unit for selective connection of the odd numbered bitlines to the bitline input/output nodes on the sense amplifiers in the odd sense amplifier block; and a second switching unit for selective connection of the first reference bitline to the reference bitline input/output node on each of the sense amplifiers in the odd sense amplifier block.

21. The nonvolatile ferroelectric memory device of claim 18, wherein said even switching circuit comprises:

a first switching unit for selective connection of the even numbered bitlines to the bitline input/output nodes on the sense amplifiers in the even sense amplifier block; and a second switching unit for selective connection of the second reference bitline to the reference bitline input/output node on each of the sense amplifiers in the odd sense amplifier block.

22. The nonvolatile ferroelectric memory of claim 18, wherein there are n number of bitlines, each of the first and second reference bitlines formed adjacent to the last bitline of n number of bit lines, where n is an even number at least equal to 2.

23. The nonvolatile ferroelectric memory of claim 22, wherein the first main cell block and the first reference cell block are repeated to form one cell array, the odd sense amplifier block are repeated to form one odd sense amplifier array and the even sense amplifier block are repeated to form even sense amplifier array.

* * * * *